United States Patent
Pinel et al.

(10) Patent No.: US 10,216,868 B2
(45) Date of Patent: Feb. 26, 2019

(54) IDENTIFYING COMBINATIONS OF ARTIFACTS MATCHING CHARACTERISTICS OF A MODEL DESIGN

(71) Applicant: International Business Machines Corporation, Armonk, NY (US)

(72) Inventors: Florian Pinel, New York, NY (US); Edward E. Seabolt, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 14/955,091

(22) Filed: Dec. 1, 2015

(65) Prior Publication Data

US 2017/0154128 A1    Jun. 1, 2017

(51) Int. Cl.
*G06F 3/00*    (2006.01)
*G06F 17/50*   (2006.01)

(52) U.S. Cl.
CPC ................ *G06F 17/5004* (2013.01)

(58) Field of Classification Search
CPC ............ G06F 9/4443; G06F 17/30864
USPC ................. 715/762; 707/706, 758
See application file for complete search history.

(56) References Cited

U.S. PATENT DOCUMENTS

| | | | |
|---|---|---|---|
| 8,782,072 B2 | 7/2014 | Bennett | |
| 8,892,594 B1 | 11/2014 | Khafizov et al. | |
| 2010/0260426 A1* | 10/2010 | Huang | G06F 17/30247 382/218 |
| 2012/0310968 A1* | 12/2012 | Tseng | G06F 17/30247 707/769 |
| 2014/0100991 A1* | 4/2014 | Lenahan | G06Q 30/0625 705/26.62 |
| 2014/0188566 A1 | 7/2014 | Pinel et al. | |
| 2015/0046483 A1* | 2/2015 | Liu | G06F 17/30247 707/758 |
| 2015/0193863 A1 | 7/2015 | Cao | |
| 2015/0341697 A1* | 11/2015 | Satterfield | H04N 21/4725 725/5 |
| 2016/0110471 A1* | 4/2016 | Bagheri | G06F 17/30864 707/706 |
| 2017/0017833 A1* | 1/2017 | Watanabe | H04N 5/915 |
| 2017/0277363 A1* | 9/2017 | Holzer | G06F 3/0481 |

OTHER PUBLICATIONS

Nussel, et al., "Method and System for performing Product Search using Visual Images of Products", An IP.com Prior Art Database Technical Disclosure, IP.com No. 000198733, IP.com Electronic Publication: Aug. 13, 2010, Copyright Yahoo! 2010, 3 pages.

* cited by examiner

*Primary Examiner* — Andy Ho
(74) *Attorney, Agent, or Firm* — Edward J. Wixted, III

(57) ABSTRACT

Analysis of descriptions accompanying designs to determine matching available artifacts. A description of a design (e.g., interior design, fashion) is analyzed to determine characteristics of the design (e.g., colors, patterns), and artifacts matching those characteristics (e.g., fabrics, furniture) are identified.

20 Claims, 3 Drawing Sheets ial detail
IDENTIFYING COMBINATIONS OF ARTIFACTS MATCHING CHARACTERISTICS OF A MODEL DESIGN

BACKGROUND

The present invention relates generally to the field of data processing, and more particularly to creation or modification of a knowledge processing system.

Traditionally, individuals view fashion, interior designs, or other artistic designs from a variety of sources, including magazine spreads. These images generally include descriptions of the design (including patterns, colors, textures, and a variety of other characteristics). Individuals must seek the products and designs featured in these traditional sources in stores.

New websites and applications allow for users to create design collages based on catalogs or other photographs. Some of these websites and applications integrate social media, communities, and people-powered searches. Individuals viewing these websites and applications can comment on the design collages. Additionally, these individuals can search online to find items featured in the design collages.

SUMMARY

According to an aspect of the present invention, there is a method, computer program product, and/or system that performs the following operations (not necessarily in the following order): (i) receiving a model design, wherein the model design includes at least one of: (a) a model image, or (b) a model description; (ii) detecting a first set of objects in the model design; (iii) determining a set of characteristics corresponding to a first object in the first set of objects; and (iv) correlating the first object to a first node in an ontology of objects based, at least in part, on the set of characteristics corresponding to the first object. At least detecting the first set of objects in the model design is performed by computer software running on computer hardware.

DETAILED DESCRIPTION

Figure 1:
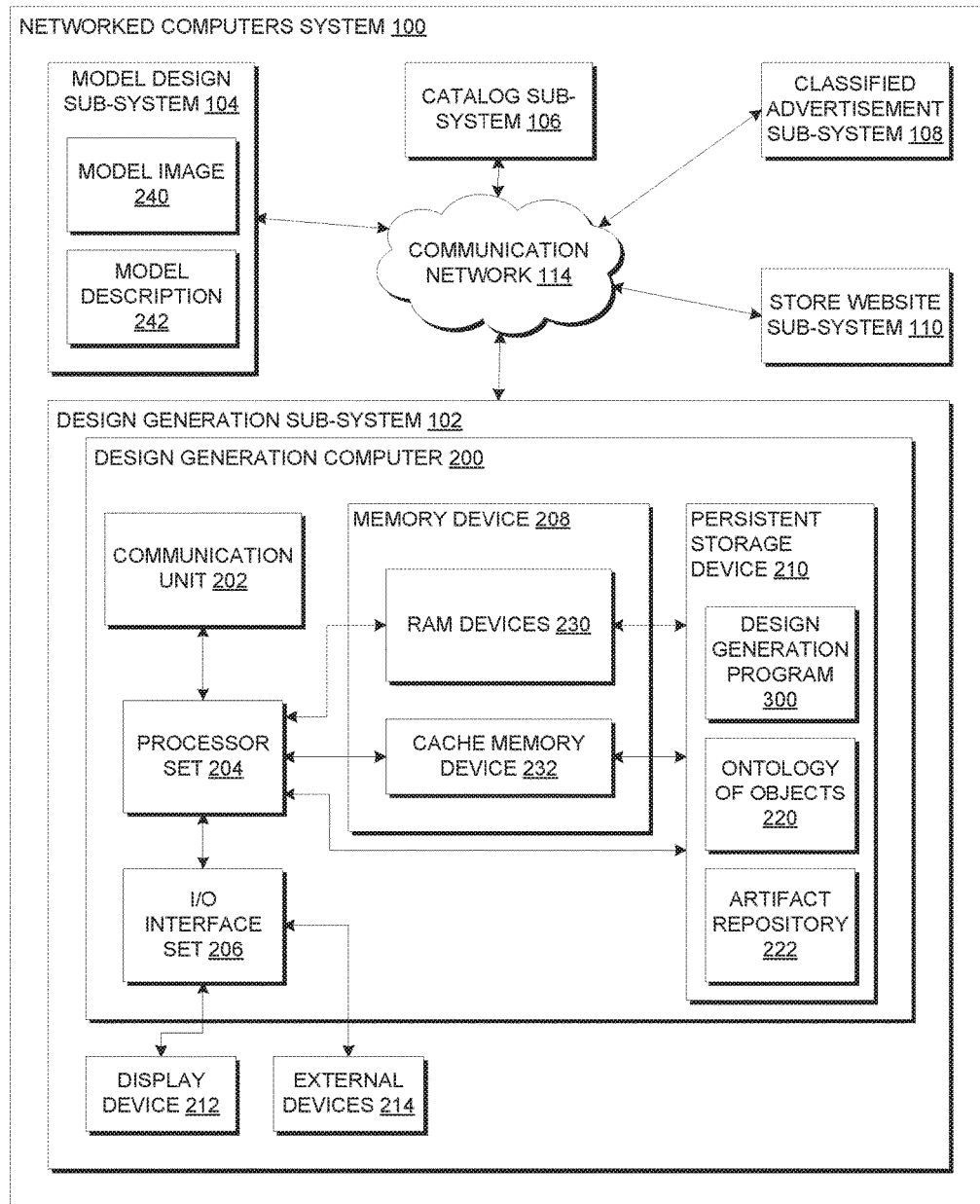
FIG. 1 is a block diagram view of a first embodiment of a system according to the present invention.

Analysis of descriptions accompanying designs to determine matching available artifacts. A description of a design (e.g., interior design, fashion) is analyzed to determine characteristics of the design (e.g., colors, patterns), and artifacts matching those characteristics (e.g., fabrics, furniture) are identified. This Detailed Description section is divided into the following sub-sections: (i) Hardware and Software Environment; (ii) Example Embodiment; (iii) Further Comments and/or Embodiments; and (iv) Definitions.

I. Hardware and Software Environment

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

An embodiment of a possible hardware and software environment for software and/or methods according to the present invention will now be described in detail with reference to the Figures. FIG. 1 is a functional block diagram illustrating various portions of networked computers system 100, including: design generation sub-system 102; model design sub-system 104; catalog sub-system 106; classified advertisement sub-system 108; store website sub-system 110; and communication network 114. Design generation sub-system 102 contains: design generation computer 200; display device 212; and external devices 214. Design generation computer 200 contains: communication unit 202; processor set 204; input/output (I/O) interface set 206; memory device 208; and persistent storage device 210. Memory device 208 contains: random access memory (RAM) devices 230; and cache memory device 232. Persistent storage device 210 contains: ontology of objects 220; artifact repository 222; and design generation program 300. Model design sub-system 104 contains: model image 240; and model description 242.

Design generation sub-system 102 is, in many respects, representative of the various computer sub-systems in the present invention. Accordingly, several portions of design generation sub-system 102 will now be discussed in the following paragraphs.

Design generation sub-system 102 may be a laptop computer, a tablet computer, a netbook computer, a personal computer (PC), a desktop computer, a personal digital assistant (PDA), a smart phone, or any programmable electronic device capable of communicating with client sub-systems via communication network 114. Design generation program 300 is a collection of machine readable instructions and/or data that is used to create, manage, and control certain software functions that will be discussed in detail, below, in the Example Embodiment sub-section of this Detailed Description section.

Design generation sub-system 102 is capable of communicating with other computer sub-systems via communication network 114. Communication network 114 can be, for example, a local area network (LAN), a wide area network (WAN) such as the Internet, or a combination of the two, and can include wired, wireless, or fiber optic connections. In general, communication network 114 can be any combination of connections and protocols that will support communications between design generation sub-system 102 and client sub-systems.

Design generation sub-system 102 is shown as a block diagram with many double arrows. These double arrows (no separate reference numerals) represent a communications fabric, which provides communications between various components of design generation sub-system 102. This communications fabric can be implemented with any architecture designed for passing data and/or control information between processors (such as microprocessors, communications processors, and/or network processors, etc.), system memory, peripheral devices, and any other hardware components within a system. For example, the communications fabric can be implemented, at least in part, with one or more buses.

Memory device 208 and persistent storage device 210 are computer readable storage media. In general, memory device 208 can include any suitable volatile or non-volatile computer readable storage media. It is further noted that, now and/or in the near future: (i) external devices 214 may be able to supply some, or all, memory for design generation sub-system 102; and/or (ii) devices external to design generation sub-system 102 may be able to provide memory for design generation sub-system 102.

Ontology of objects 220 is a repository of various nodes. Some of the nodes in ontology of objects 220 include names of various objects and/or artifacts that can appear in a model design. In some embodiments of the present invention, ontology of objects 220 includes generalized descriptions of the various objects and/or artifacts. Alternatively, ontology of objects 220 includes generalized images of the various objects and/or artifacts. In further alternative embodiments, various nodes in ontology of objects 220 are organized in a hierarchy. In some embodiments, design generation sub-system 102 receives ontology of objects 220 and/or various nodes to populate ontology of objects 220 as an input. Alternatively, design generation sub-system 102 creates ontology of objects 220 and/or populates ontology of objects 220 with various nodes based, at least in part, on a model design.

Artifact repository 222 is a repository of descriptions, images, and/or factors relating to various artifacts. Various modules in design generation program 300 can refer to the artifacts in artifact repository 222. Artifacts in artifact repository correspond to various nodes in ontology of objects 220. Artifact repository 222 also includes procurement information about various artifacts.

Design generation program 300 is stored in persistent storage device 210 for access and/or execution by one or more processors of processor set 204, usually through memory device 208. Persistent storage device 210: (i) is at least more persistent than a signal in transit; (ii) stores the program (including its soft logic and/or data) on a tangible medium (such as magnetic or optical domains); and (iii) is substantially less persistent than permanent storage. Alternatively, data storage may be more persistent and/or permanent than the type of storage provided by persistent storage device 210.

Design generation program 300 may include both substantive data (that is, the type of data stored in a database) and/or machine readable and performable instructions. In this particular embodiment (i.e., FIG. 1), persistent storage device 210 includes a magnetic hard disk drive. To name some possible variations, persistent storage device 210 may include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage device 210 may also be removable. For example, a removable hard drive may be used for persistent storage device 210. Other examples include optical and magnetic disks, thumb drives, and smart cards that are inserted into a drive for transfer onto another computer readable storage medium that is also part of persistent storage device 210.

Communication unit 202, in these examples, provides for communications with other data processing systems or devices external to design generation sub-system 102. In these examples, communication unit 202 includes one or more network interface cards. Communication unit 202 may provide communications through the use of either or both physical and wireless communications links. Any software modules discussed herein may be downloaded to a persistent storage device (such as persistent storage device 210) through a communications unit (such as communication unit 202).

I/O interface set 206 allows for input and output of data with other devices that may be connected locally in data communication with design generation computer 200. For example, I/O interface set 206 provides a connection to external devices 214. External devices 214 will typically include devices, such as a keyboard, a keypad, a touch screen, and/or some other suitable input device. External devices 214 can also include portable computer readable storage media, such as, for example, thumb drives, portable optical or magnetic disks, and memory cards. Software and data used to practice embodiments of the present invention (e.g., design generation program 300) can be stored on such portable computer readable storage media. In these embodiments, the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus, the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

II. Example Embodiment

Figure 2:
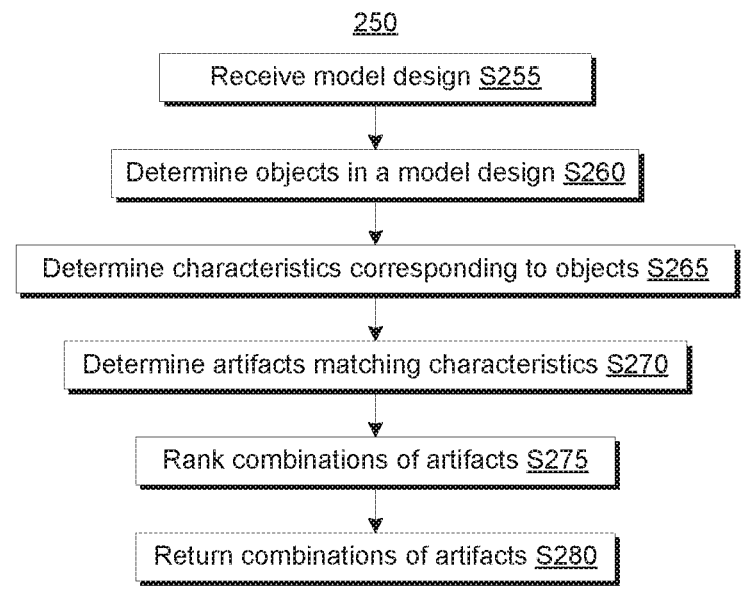
FIG. 2 is a flowchart showing a first embodiment method performed, at least in part, by the first embodiment system.
Figure 3:
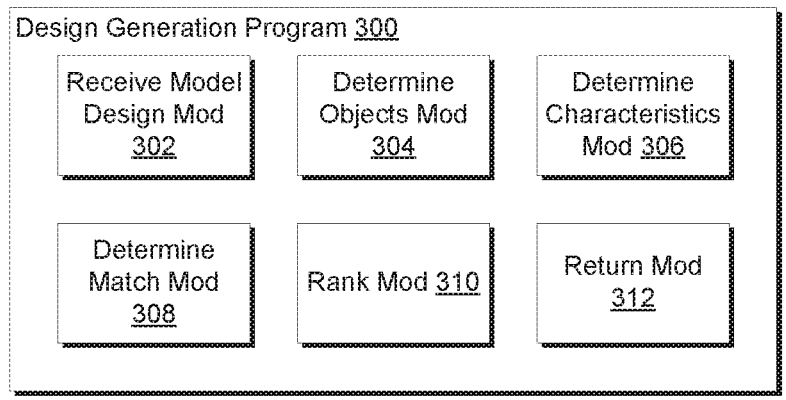
FIG. 3 is a block diagram view of a machine logic (e.g., software) portion of the first embodiment system.
Figure 4:
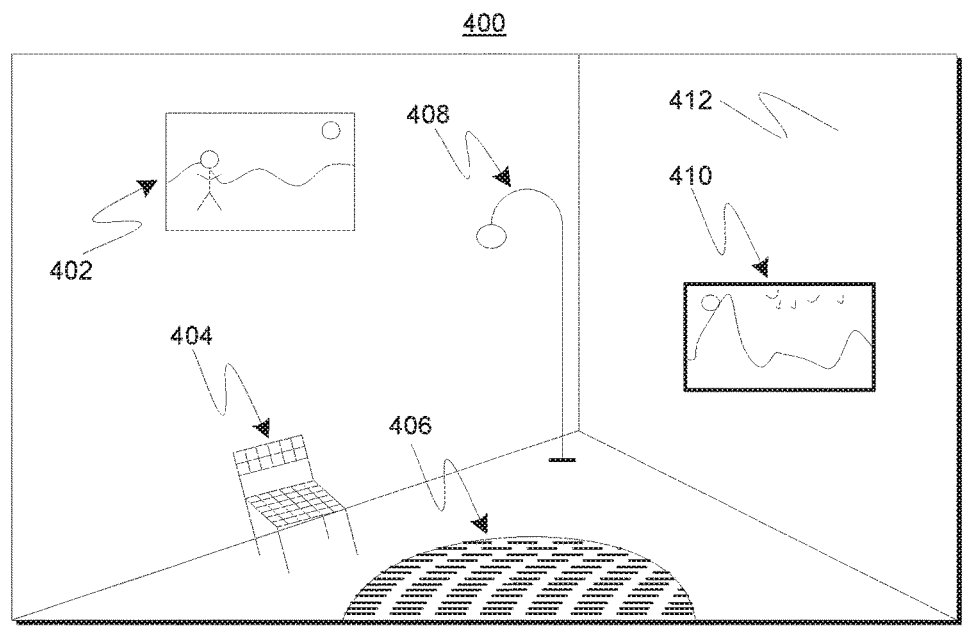
FIG. 4 is a screenshot of a model design according to an embodiment of a system according to the present invention.

FIG. 2 shows flowchart 250 depicting a method according to the present invention. FIG. 3 shows design generation program 300, which performs at least some of the method operations of flowchart 250. This method and associated software will now be discussed, over the course of the following paragraphs, with extensive reference to FIG. 2 (for the method operation blocks) and FIG. 3 (for the software blocks). In this example, John has selected model image 400 from a magazine as a model for a room he would like to design (FIG. 4), and he is looking for places to purchase the furniture and accessories to complete the design.

Processing beings at operation S255, where receive model design mod 302 receives a model design. In this example, receive model design mod 302 receives model image 400 (FIG. 4) as a model design. Here, model design mod 302 does not receive any text descriptions describing the various parts of model image 400. In some embodiments of the present invention, receive model design mod 302 receives a model image. Alternatively, receive model design mod 302 receives a model description. In some embodiments, receive model design mod 302 receives a model description in audio format.

Processing proceeds to operation S260, where determine objects mod 304 determines a set of objects in a model design. Determining a set of objects is sometimes also called detecting a set of objects. In this example, model image 400 includes six objects: picture 402; chair 404; rug 406; lamp 408; television 410; and wall 412. Initially, determine objects mod 304 identifies some of the objects without referring to ontology of objects 220; in this example, determine objects mod 304 identifies chair 404 as a chair, lamp 408 as a lamp, and wall 412 as a wall. After reference to ontology of objects 220, determine objects mod 304 correlates additional objects with nodes in ontology of objects 220; in this example, determine objects mod 304 identifies rug 406 as a flooring and television 410 as a television. Determine objects mod 304 can also identify some objects without being able to identify a node in ontology of objects 220 to which the object corresponds; in this example, determine objects mod 304 identifies picture 402 as an object, but cannot determine the node to which it corresponds.

Processing proceeds to operation S265, where determine characteristics mod 306 determines a set of characteristics corresponding to a set of objects in a model design. In this example, determine characteristics mod 306 determines a set of characteristics corresponding to each of the objects identified by determine objects mod 304. In this example, determine characteristics mod 306 determines: (i) chair 404 is a chair made of thin, black metal with a checkerboard pattern on the seat and the back; (ii) rug 406 is a flooring that is white, circular, and shag textured; (iii) lamp 408 is a floor lamp that is arched and made of brushed metal; (iv) television 410 is a flat-screen television having a 16:9 aspect ratio; and (v) wall 412 is a wall painted an eggshell color with a matte finish. Further, determine characteristics mod 306 determines that picture 402 is an object showing a nature scene with a person in the foreground.

Processing proceeds to operation S270, where determine match mod 308 determines a set of artifacts matching a set of characteristics corresponding to a set of objects. Determine match mod 308 searches various catalogs and repositories to determine a set of artifacts matching the set of characteristics determined by determine characteristics mod 306. In this example, determine match mod 308 determines that: (i) a chair with similar characteristics to chair 404 is for sale at both a local antiques store and an online classified advertisement website; (ii) floorings similar to rug 406 are available from a variety of carpet stores within a 20-minute drive of John's address; (iii) a lamp matching the characteristics of lamp 408 is available from an online hardware store; (iv) various televisions are available online similar to television 410; and (v) two companies make paint matching the color and finish of wall 412. Because determine objects mod 304 was unable to identify a node in ontology of objects 220 corresponding to picture 402, determine match mod 308 identified a variety of artifacts similar to picture 402, but the identified artifacts correspond to a variety of nodes within ontology of objects 220: (i) paintings; (ii) windows; and (iii) pictures. In some embodiments of the present invention, determine match mod 308 determines a set of artifacts match a style of a model image as a whole (i.e., not on an object-by-object basis). For example, determine match mod 308 determines a set of artifacts that match a colonial style.

Processing proceeds to operation S275, where rank mod 310 ranks a set of artifacts based, at least in part, on a similarity to a set of characteristics corresponding to a set of objects. In some embodiments of the present invention, rank mod 310 ranks a set of artifacts based, at least in part, on a similarity among various artifacts. In this example, rank mod 310 ranks the various artifacts identified by determine match mod 308. Here, rank mod 310 ranks: (i) the chair available at the antiques store higher than the chair available from the classified advertisement based on reliability and previous use; (ii) the various carpet stores based on distance from John; (iii) the various televisions based on price; and (iv) the paint companies based on reviews from past customers. Rank mod 310 can rank the various artifacts in a variety of manners. In some embodiments of the present invention, rank mod 310 uses a relative ranking system, ordering various artifacts from a single node. In some alternative embodiments, rank mod 310 creates a numerical score for each identified artifact. In some embodiments of the present invention, a ranking is also based, at least in part on an availability of multiple artifacts from a single location; e.g., one of the paint companies distributes its paint to the hardware store selling the lamp, the score for that paint would improve because John could consolidate two purchases into one. In some alternative embodiments, rank mod 310 ranks a set of combinations of artifacts. For example, rank mod 310 ranks a combination of a first lamp with a first chair against: (i) a combination of a second lamp and the first chair; and (ii) a combination of a third lamp and a second chair.

Processing terminates at operation S280, where return mod 312 returns a set of artifacts to a user. In this example, return mod 312 returns the set of ranked artifacts to John. Return mod 312 can return the set of ranked artifacts in a variety of formats. In some embodiments of the present invention, return mod 312 returns a list of all artifacts in ranked order. Alternatively, return mod 312 returns a variety of lists of artifacts in ranked order based on the identified object. In some further alternative embodiments, return mod 312 returns a set of combinations of artifacts. In some embodiments of the present invention, return mod 312 returns a sortable list of artifacts including a variety of factors used by rank mod 310 to rank the artifacts.

III. Further Comments and/or Embodiments

Some embodiments of the present invention recognize the following facts, potential problems, and/or potential areas for improvement with respect to the current state of the art: (i) designs in magazines incorporate products that are no longer in production and/or for sale; (ii) designs in magazines incorporate products that are more expensive than a user can afford; (iii) designs on new websites and/or applications incorporate elements that do not fit a style of a user; and/or (iv) designs on new websites and/or applications are not professionally created.

Figure 5:
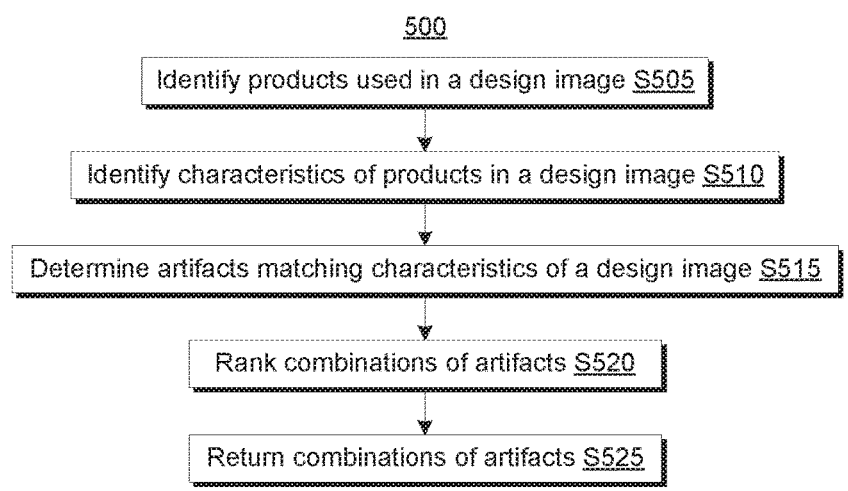
FIG. 5 is a flowchart showing a second embodiments method performed, at least in part, by an embodiment of a system according to the present invention.

FIG. 5 shows flowchart 500 depicting a method according to the present invention. Flowchart 500 depicts an alternative method of applying a design generation sub-system to a model design.

Processing begins at operation S505, where a design generation sub-system identifies a set of products used in a design image. A design image is sometimes also called a model design and/or a design. In some embodiments of the present invention, a design generation sub-system uses image recognition techniques on a design image. In some of those embodiments, a design generation sub-system uses image recognition techniques to identify a set of products in a design image. In some alternative embodiments, a design generation sub-system uses neuro-linguistic programming techniques on a description accompanying a design image. In further embodiments, a design generation sub-system uses natural language programming to identify a set of products in a design image. In some of those embodiments, a design generation sub-system uses natural language processing on a description accompanying a design image. In some embodiments of the present invention, a design generation sub-system only analyzes a description of a model design, without analyzing an image of the model design. In some embodiments, a design generation sub-system analyzers a description of a model design that does not describe every element of a design image. In some of these embodiments, a design generation sub-system determines a set of objects likely to occur in a model image that are not described in a description of the model image. Alternatively, a design generation sub-system only analyzes an image of a model design without analyzing a description of the model design. In some embodiments of the present invention, a design generation sub-system includes an ontology of design terms. In some of those embodiments, a design generation sub-system includes an ontology of interior design elements (e.g., colors, patterns). For example, a design generation sub-system determines a model design includes a set of dark wood furniture in the mission style. In some further embodiments, a design generation sub-system includes an ontology of fashion design elements (e.g., styles, materials, fabrics). In some embodiments of the present invention, a design generation sub-system generates a list of elements in a model design.

Processing proceeds to operation S510, where a design generation sub-system identifies a set of characteristics of a set of products in a design image. In some embodiments of the present invention, a design generation sub-system includes an ontology of design characteristics. In some of those embodiments, a design generation sub-system includes an ontology of interior design characteristics (e.g., table, carpet, metal, shag). In some alternative embodiments, a design generation sub-system includes an ontology of fashion design characteristics (e.g., stripes, plaid, wool). In some embodiments of the present invention, a design generation sub-system uses natural language programming to identify a set of characteristics in a design image. Alternatively, a design generation sub-system uses image recognition techniques to identify a set of characteristics in a design image. In further alternative embodiments, a design generation sub-system uses a combination of natural language programming and image recognition techniques to identify a set of characteristics in a design image.

Processing proceeds to operation S515, where a design generation sub-system determines a set of artifacts matching a set of characteristics of a set of products in a design image. Matching a set of characteristics of a model design does not necessarily mean that an artifact is identical to a model design. In some embodiments of the present invention, a design generation sub-system determines a set of artifacts matching a set of characteristics of a set of products in a design image based, at least in part, on degrees of similarity. In some embodiments of the present invention, a design generation sub-system uses image recognition to determine a set of artifacts matching a set of characteristics of a model design. In some alternative embodiments, a design generation sub-system uses natural language processing to determine a set of artifacts matching a set of characteristics of a model design. In further alternative embodiments, a design generation sub-system uses neuro-linguistic programming techniques to determine a set of artifacts matching a set of characteristics of a model design. Alternatively, a design generation sub-system uses a combination of one or more of image recognition, natural language processing, and/or neuro-linguistic programming techniques to determine a set of artifacts matching a set of characteristics of a model design. In some embodiments of the present invention, a design generation sub-system determines a set of artifacts available for sale that match a set of characteristics of a model design. In some embodiments of the present invention, a design generation sub-system determines a set of artifacts matching a set of characteristics of a model design based, at least in part, on a similarity in design of an artifact to a model design. In some of those embodiments, a design generation sub-system determines a similarity in design of an artifact based, at least in part, on a quantity of characteristics in a set of model design characteristics that exist in the artifact.

Processing proceeds to operation S520, where a design generation sub-system ranks a set of combinations of a set of artifacts. Ranking a set of combinations is sometimes also called scoring a set of combinations. In some embodiments of the present invention, a design generation sub-system ranks a set of combinations of artifacts based, at least in part, on price. In some alternative embodiments, a design generation sub-system ranks a set of combinations of artifacts based, at least in part, on a location of a set of artifacts in a combination of artifacts in the set of combinations of artifacts. In some further alternative embodiments, a design generation sub-system ranks a set of combinations of artifacts based, at least in part, on a similarity in design of a set of artifacts in a combination of artifacts in the set of combinations of artifacts. In some of those embodiments, a design generation sub-system ranks a set of combinations of artifacts based, at least in part, on color. Alternatively, a design generation sub-system ranks a set of combinations of artifacts based, at least in part, on pattern harmony. In some of those alternative embodiments, a design generation sub-system determines a pattern harmony based, at least in part, on a corpus of existing designs.

Processing terminates at operation S525, where a design generation sub-system returns a set of combinations of a set of artifacts. In some embodiments of the present invention, a design generation sub-system returns all sets of combinations of artifacts to a user. Alternatively, a design generation sub-system returns only some sets of combinations of artifacts to a user. In some embodiments of the present invention, a design generation sub-system includes a threshold relating to a number of sets of combinations of artifacts to return to a user.

Some embodiments of the present invention may include one, or more, of the following features, characteristics, and/or advantages: (i) receiving an image of a model design; (ii) receiving a description of a model design; (iii) analyzing a model design; (iv) determining a set of characteristics for a model design; (v) determining a set of artifacts matching a set of characteristics for a model design; (vi) ranking a set of combinations of artifacts; and/or (vii) returning a set of combinations of artifacts to a user.

Some embodiments of the present invention may include one, or more, of the following features, characteristics, and/or advantages: (i) identifying a set of products used in a model design; (ii) identifying a set of characteristics of a model design; (iii) determining a set of artifacts that match a set of characteristics of a model design; (iv) ranking a set of combinations of artifact; and/or (v) returning a set of combinations of artifacts to a user.

Some embodiments of the present invention may include one, or more, of the following features, characteristics, and/or advantages: (i) creating combinations of artifacts based, at least in part, on a model design; (ii) grouping a set of artifacts into a set of categories; (iii) generating a set of combinations of artifacts based, at least in part, on a model design; (iv) generating a set of combinations of artifacts based, at least in part, on what artifacts are available for sale;

(v) examining catalogs for available artifacts; and/or (vi) recommending a set of artifacts based, at least in part, on a model design.

Some embodiments of the present invention may include one, or more, of the following features, characteristics, and/or advantages: (i) receiving an image of a model design; (ii) receiving a description of a model design; (iii) identifying a set of elements (e.g., furniture, fabrics) in a model design; (iv) identifying a set of characteristics of a set of elements in a model design; (v) returning a set of combinations of artifacts; and/or (vi) returning a set of combinations of artifacts available for sale.

Some embodiments of the present invention may include one, or more, of the following features, characteristics, and/or advantages: (i) receiving a plurality of model designs; (ii) determining a set of artifacts that match a set of characteristics across a plurality of model designs; (iii) employing a work product generator to determine a set of characteristics of a model design; (iv) employing a work product generator to determine a set of artifacts that match a set of characteristics of a model design; and/or (v) grouping a set of artifacts into a set of categories.

Some embodiments of the present invention may include one, or more, of the following features, characteristics, and/or advantages: (i) creating a creative combination of artifacts; (ii) evaluating a similarity of an artifact to a model design; (iii) determining a popularity of an artifact based, at least in part, on social media; (iv) using cognitive software to determine a set of characteristics of a model design; and/or (v) using cognitive software to determine a similarity of an artifact to a model design.

Some embodiments of the present invention may include one, or more, of the following features, characteristics, and/or advantages: (i) determining a new style based, at least in part, on a set of characteristics of a model design; (ii) determining a new fashion based, at least in part, on a set of characteristics of a model design; (iii) determining a trending style based, at least in part, on a set of characteristics of a model design; (iv) determining a trending fashion based, at least in part, on a set of characteristics of a model design; (v) determining a popular style based, at least in part, on a set of characteristics of a model design; and/or (vi) determining a popular fashion based, at least in part, on a set of characteristics of a model design.

Some embodiments of the present invention may include one, or more, of the following features, characteristics, and/or advantages: (i) combining image recognition and natural language processing to improve determination of characteristics of a model design; (ii) combining image recognition and natural language processing to improve determination of a similarity of an artifact to characteristics of a model design; (iii) employing a collaborative filter based, at least in part, on social media; (iv) matching characteristics of a model design to an ontology of objects; (v) matching characteristics of a model design to nodes in an ontology of objects; (vi) generating a list of types of artifacts based, at least in part, on a set of characteristics of a model design; and/or (vii) extracting a set of characteristics of a model design.

In some embodiments of the present invention, a design generation sub-system is used to determine designs related to gardening. Alternatively, a design generation sub-system is used to determine designs related to fashion. In some embodiments, a design generation sub-system is used to determine books on a bookshelf. In some embodiments of the present invention, a design generation sub-system receives a plurality of model designs. In some of these embodiments, a design generation sub-system generates a design based, at least in part, on a plurality of model designs.

IV. Definitions

"Present invention" does not create an absolute indication and/or implication that the described subject matter is covered by the initial set of claims, as filed, by any as-amended set of claims drafted during prosecution, and/or by the final set of claims allowed through patent prosecution and included in the issued patent. The term "present invention" is used to assist in indicating a portion or multiple portions of the disclosure that might possibly include an advancement or multiple advancements over the state of the art. This understanding of the term "present invention" and the indications and/or implications thereof are tentative and provisional and are subject to change during the course of patent prosecution as relevant information is developed and as the claims may be amended.

"Embodiment," see the definition for "present invention."

"And/or" is the inclusive disjunction, also known as the logical disjunction and commonly known as the "inclusive or." For example, the phrase "A, B, and/or C," means that at least one of A or B or C is true; and "A, B, and/or C" is only false if each of A and B and C is false.

A "set of" items means there exists one or more items; there must exist at least one item, but there can also be two, three, or more items. A "subset of" items means there exists one or more items within a grouping of items that contain a common characteristic.

A "plurality of" items means there exists at more than one item; there must exist at least two items, but there can also be three, four, or more items.

"Includes" and any variants (e.g., including, include, etc.) means, unless explicitly noted otherwise, "includes, but is not necessarily limited to."

A "user" or a "subscriber" includes, but is not necessarily limited to: (i) a single individual human; (ii) an artificial intelligence entity with sufficient intelligence to act in the place of a single individual human or more than one human; (iii) a business entity for which actions are being taken by a single individual human or more than one human; and/or (iv) a combination of any one or more related "users" or "subscribers" acting as a single "user" or "subscriber."

The terms "receive," "provide," "send," "input," "output," and "report" should not be taken to indicate or imply, unless otherwise explicitly specified: (i) any particular degree of directness with respect to the relationship between an object and a subject; and/or (ii) a presence or absence of a set of intermediate components, intermediate actions, and/or things interposed between an object and a subject.

A "module" is any set of hardware, firmware, and/or software that operatively works to do a function, without regard to whether the module is: (i) in a single local proximity; (ii) distributed over a wide area; (iii) in a single proximity within a larger piece of software code; (iv) located within a single piece of software code; (v) located in a single storage device, memory, or medium; (vi) mechanically connected; (vii) electrically connected; and/or (viii) connected in data communication. A "sub-module" is a "module" within a "module."

A "computer" is any device with significant data processing and/or machine readable instruction reading capabilities including, but not necessarily limited to: desktop computers; mainframe computers; laptop computers; field-programmable gate array (FPGA) based devices; smart phones; personal digital assistants (PDAs); body-mounted or inserted computers; embedded device style computers; and/or application-specific integrated circuit (ASIC) based devices.

"Electrically connected" means either indirectly electrically connected such that intervening elements are present or directly electrically connected. An "electrical connection" may include, but need not be limited to, elements such as capacitors, inductors, transformers, vacuum tubes, and the like.

"Mechanically connected" means either indirect mechanical connections made through intermediate components or direct mechanical connections. "Mechanically connected" includes rigid mechanical connections as well as mechanical connection that allows for relative motion between the mechanically connected components. "Mechanically connected" includes, but is not limited to: welded connections; solder connections; connections by fasteners (e.g., nails, bolts, screws, nuts, hook-and-loop fasteners, knots, rivets, quick-release connections, latches, and/or magnetic connections); force fit connections; friction fit connections; connections secured by engagement caused by gravitational forces; pivoting or rotatable connections; and/or slidable mechanical connections.

A "data communication" includes, but is not necessarily limited to, any sort of data communication scheme now known or to be developed in the future. "Data communications" include, but are not necessarily limited to: wireless communication; wired communication; and/or communication routes that have wireless and wired portions. A "data communication" is not necessarily limited to: (i) direct data communication; (ii) indirect data communication; and/or (iii) data communication where the format, packetization status, medium, encryption status, and/or protocol remains constant over the entire course of the data communication.

The phrase "without substantial human intervention" means a process that occurs automatically (often by operation of machine logic, such as software) with little or no human input. Some examples that involve "no substantial human intervention" include: (i) a computer is performing complex processing and a human switches the computer to an alternative power supply due to an outage of grid power so that processing continues uninterrupted; (ii) a computer is about to perform resource intensive processing and a human confirms that the resource-intensive processing should indeed be undertaken (in this case, the process of confirmation, considered in isolation, is with substantial human intervention, but the resource intensive processing does not include any substantial human intervention, notwithstanding the simple yes-no style confirmation required to be made by a human); and (iii) using machine logic, a computer has made a weighty decision (for example, a decision to ground all airplanes in anticipation of bad weather), but, before implementing the weighty decision the computer must obtain simple yes-no style confirmation from a human source.

"Automatically" means "without any human intervention."

The term "real time" includes any time frame of sufficiently short duration as to provide reasonable response time for information processing as described. Additionally, the term "real time" includes what is commonly termed "near real time," generally any time frame of sufficiently short duration as to provide reasonable response time for on-demand information processing as described (e.g., within a portion of a second or within a few seconds). These terms, while difficult to precisely define, are well understood by those skilled in the art.

What is claimed is:

1. A method comprising:
receiving a model image;
detecting a first plurality of objects in the model image, wherein the first plurality of objects comprise a first object and a second object;
determining, by one or more processors, a first set of characteristics corresponding to the first object and a second set of characteristics corresponding to the second object;
correlating the first object to a first node in an ontology of objects based, at least in part, on the first set of characteristics corresponding to the first object; and
correlating the second object to a second node in the ontology of objects based, at least in part, on the second set of characteristics corresponding to the second object.

2. The method of claim 1, wherein detecting the first plurality of objects in the model image is based, at least in part, on the ontology of objects.

3. The method of claim 1, wherein detecting the first plurality of objects in the model image further includes:
performing a natural language processing on a model description associated with the model image.

4. The method of claim 1, wherein detecting the first plurality of objects in the model image further includes:
performing an image recognition processing on the model image.

5. The method of claim 1, further comprising:
determining a second plurality of objects having a similarity to the first set of characteristics corresponding to the first object;
wherein:
the second plurality of objects are associated with the first node in the ontology of objects.

6. The method of claim 5, further comprising:
ranking objects in the second plurality of objects based, at least in part, on the similarity to the first set of characteristics corresponding to the first object.

7. The method of claim 5, further comprising:
returning the second set of objects to a user.

8. The method of claim 1, further comprising:
returning a first ranked set of objects corresponding to the first object, wherein the ranking is based on customer reviews.

9. The method of claim 1, further comprising:
returning a first ranked set of objects corresponding to the first object, wherein the ranking is based on purchase price.

10. The method of claim 1, further comprising:
returning a first ranked set of objects corresponding to the first object, wherein the ranking is based on procurement availability distance from a location of a user.

11. The method of claim 1, further comprising:
returning a first ranked set of objects corresponding to the first object and a second ranked set of objects corresponding to the second object, wherein the ranking is based on procurement availability at a single location.

12. A computer program product comprising:
a computer readable storage medium and program instructions stored on the computer readable storage medium, the program instructions comprising:
program instructions to receive a model image
program instructions to detect a first plurality of objects in the model image, wherein the first plurality of objects comprise a first object and a second object;

program instructions to determine a first set of characteristics corresponding to the first object and a second set of characteristics corresponding to the second object;
program instructions to correlate the first object to a first node in an ontology of objects based, at least in part, on the first set of characteristics corresponding to the first object; and
program instructions to correlate the second object to a second node in the ontology of objects based, at least in part, on the second set of characteristics corresponding to the second object.

13. The computer program product of claim 12, further comprising:
program instructions to determine a second plurality of objects having a similarity to the first set of characteristics corresponding to the first object;
wherein:
the second plurality of objects are associated with the first node in the ontology of objects.

14. The computer program product of claim 13, further comprising:
program instructions to rank objects in the second plurality of objects based, at least in part, on the similarity to the first set of characteristics corresponding to the first object.

15. A computer system comprising:
one or more computer processors, one or more computer readable storage media, and program instructions stored on the one or more computer readable storage media for execution by at least one of the one or more computer processors, the program instructions comprising:
program instructions to receive a model image
program instructions to detect a first plurality of objects in the model image, wherein the first plurality of objects comprise a first object and a second object;
program instructions to determine a first set of characteristics corresponding to the first object and a second set of characteristics corresponding to the second object;
program instructions to correlate the first object to a first node in an ontology of objects based, at least in part, on the first set of characteristics corresponding to the first object; and
program instructions to correlate the second object to a second node in the ontology of objects based, at least in part, on the second set of characteristics corresponding to the second object.

16. The computer system of claim 15, wherein program instructions to detect the first plurality of objects in the model image is based, at least in part, on the ontology of objects.

17. The computer system of claim 15, wherein program instructions to detect the first plurality of objects in the model image further include:
program instructions to perform a natural language processing on a model description associated with the model image.

18. The computer system of claim 15, wherein program instructions to detect the first plurality of objects in the model image further include:
program instructions to perform an image recognition processing on the model image.

19. The computer system of claim 15, further comprising:
program instructions to determine a second plurality of objects having a similarity to the first set of characteristics corresponding to the first object;
wherein:
the second plurality of objects are associated with the first node in the ontology of objects.

20. The computer system of claim 19, further comprising:
program instructions to rank objects in the second plurality of objects based, at least in part, on the similarity to the first set of characteristics corresponding to the first object.

* * * * *